United States Patent
Tang et al.

(10) Patent No.: US 11,215,512 B2
(45) Date of Patent: Jan. 4, 2022

(54) LIGHT INTENSITY FLUCTUATION-INSENSITIVE PROJECTION OBJECTIVE WAVE ABERRATION DETECTION DEVICE AND DETECTION METHOD THEREOF

(71) Applicant: Shanghai Institute of Optics And Fine Mechanics, Chinese Academy of Sciences, Shanghai (CN)

(72) Inventors: Feng Tang, Shanghai (CN); Xiangzhao Wang, Shanghai (CN); Yunjun Lu, Shanghai (CN); Changzhe Peng, Shanghai (CN); Yang Liu, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 17/033,669

(22) Filed: Sep. 25, 2020

(65) Prior Publication Data

US 2021/0208005 A1   Jul. 8, 2021

(30) Foreign Application Priority Data

Jan. 2, 2020 (CN) .......................... 202010000986.8

(51) Int. Cl.
*G01J 9/02* (2006.01)
*G01B 9/02* (2006.01)
(Continued)

(52) U.S. Cl.
CPC ........ *G01J 9/0215* (2013.01); *G01B 9/02098* (2013.01); *G01M 11/0271* (2013.01); *G03F 7/706* (2013.01)

(58) Field of Classification Search
CPC ... G01J 9/0215; G01M 11/0271; G03F 7/706; G01B 9/02098
See application file for complete search history.

(56) References Cited

U.S. PATENT DOCUMENTS

| | | | |
|---|---|---|---|
| 6,650,399 B2* | 11/2003 | Baselmans | G03F 7/706 355/55 |
| 7,088,458 B1* | 8/2006 | Wegmann | G01J 9/02 356/124 |

(Continued)

OTHER PUBLICATIONS

U.S. Appl. No. 16/689,023, filed Nov. 19, 2019, Feng Tang et al.
(Continued)

*Primary Examiner* — Violeta A Prieto
(74) *Attorney, Agent, or Firm* — Mei & Mark LLP; Manni Li

(57) ABSTRACT

A light intensity fluctuation-insensitive projection objective wave aberration detection device and a detection method thereof, comprising a light source and illumination system, an object plane marking plate, an object plane displacement table, a tested projection objective, an image plane marking plate, a two-dimensional photosensor, an image plane displacement table and a control processing unit; the object plane marking plate and the image plane marking plate are provided with grating marks for shear interference test and marks for light intensity test, the shear interferograms and the light intensity information are simultaneously received through the two-dimensional photosensor, the light intensity fluctuation error corresponding to each phase-shifting interferogram is corrected through the light intensity information, improving the detection precision, reducing the complexity and the cost of the system, and improving the detection speed.

7 Claims, 5 Drawing Sheets

(51) Int. Cl.
*G01M 11/02* (2006.01)
*G03F 7/20* (2006.01)

(56) References Cited

U.S. PATENT DOCUMENTS

| | | | |
|---|---|---|---|
| 7,333,216 B2 | 2/2008 | Wegmann et al. | |
| 7,336,371 B1* | 2/2008 | Haidner | G01M 11/0271 356/515 |
| 7,417,745 B2 | 8/2008 | Haidner et al. | |
| 9,766,154 B2* | 9/2017 | Dai | G01M 11/0271 |
| 11,029,611 B2* | 6/2021 | Tang | G01J 9/0215 |
| 2005/0200940 A1* | 9/2005 | Emer | G03F 7/706 359/299 |
| 2005/0243328 A1* | 11/2005 | Wegmann | G03F 7/2041 356/520 |
| 2006/0001861 A1* | 1/2006 | Wegmann | G03F 7/706 356/124 |
| 2009/0021726 A1* | 1/2009 | Wegmann | G03F 7/2041 356/124 |
| 2009/0257049 A1* | 10/2009 | Wegmann | G03F 7/706 356/124 |
| 2010/0302523 A1* | 12/2010 | Shiraishi | G03F 7/706 355/67 |
| 2012/0113429 A1* | 5/2012 | Wegmann | G03F 7/2041 356/450 |
| 2014/0022524 A1* | 1/2014 | Wegmann | G03F 7/706 355/67 |
| 2017/0131176 A1* | 5/2017 | Dai | G03F 7/706 |
| 2018/0087891 A1* | 3/2018 | Wegmann | G03F 7/706 |
| 2020/0003655 A1* | 1/2020 | Ehrmann | G01M 11/0271 |
| 2020/0292384 A1 | 9/2020 | Lu et al. | |
| 2021/0026250 A1* | 1/2021 | Tang | G01M 11/0271 |

OTHER PUBLICATIONS

J. Braat et al., "Improved Ronchi test with extended source," Journal of the Optical Society of America A., vol. 16, No. 1, pp. 131-140 (1999).

* cited by examiner

LIGHT INTENSITY FLUCTUATION-INSENSITIVE PROJECTION OBJECTIVE WAVE ABERRATION DETECTION DEVICE AND DETECTION METHOD THEREOF

CROSS-REFERENCE TO RELATED APPLICATIONS

The subject application claims priority on Chinese Application No. CN202010000986.8 filed on Jan. 2, 2020 in China. The contents and subject matter of the Chinese priority application is incorporated herein by reference.

TECHNICAL FIELD

The present invention relates to a lithography machine, in particular, a projection objective wave aberration detection device that is insensitive to light intensity fluctuation and a detection method thereof.

BACKGROUND ART

The Ronchi grating shear interferometer has the advantages of common optical path, no space optical path difference, no need of an independent ideal reference wave surface, high precision, high sensitivity, and simple structure, which is effective to measure wave aberration of an optical system. Especially for high-end projection lithography machine, the shear interferometer is one of the main technical solutions for in-situ and off-line wave aberration detection for projection objective.

An improved grating shear interferometer with extended light source has been disclosed, see O. Braat et al., Journal of the Optical Society of America A, Vol. 16, No. 1, pp. 131-140 (1999), and in the tested optical system, a one-dimensional grating with a duty ratio of 1:1 is adopted on the object plane, and a one-dimensional quasi-cosine grating is adopted on the image plane to suppress high-order diffraction, so that phase extraction is carried out only by interference of ±1-order diffraction light and 0-order light. Because shear interference needs at least two shear wavefronts in orthogonal shear directions to reconstruct the original wavefront, both the object and image plane gratings need to be switched when the scheme is adopted.

U.S. Pat. No. 7,333,216 discloses shear interference similar to Braat et al. for wave aberration detection for the lithography projection objective. One two-dimensional grating is disclosed to be adopted in the object plane, and a multi-channel wave aberration detection scheme comprising placing detection marks at the positions of a plurality of conjugate field-of-view points on the object image plan, so that the detector simultaneously receives interferograms of the plurality of field-of-view points and simultaneously obtains wave aberration of the plurality of field-of-view point positions.

U.S. Pat. No. 7,417,745 describes the phase shifting algorithm of the above-mentioned art, wherein a one-dimensional grating is used for the object plane and one two-dimensional grating is used for the image plane, and the grating period of the object plane is matched with the grating period of the image plane based on the magnification of the tested projection objective; since the image plane adopts the two-dimensional grating, the image plane grating cannot be switched in the measurement process. Chinese Invention Patent Application Nos. 201910183242.1 and 201910664574.1 disclose improved phase shift detection method and grating structure for the technology.

The above-mentioned technology is mainly applied to in-situ detection of projection lithography machine and off-line detection of projection objective. The wavelengths of projection lithography light sources are 365 nm, 248 nm, 193 nm, and 13.5 nm, among which 248 nm, 193 nm, and 13.5 nm are pulsed light sources, and the energy between each pulse of light fluctuates. In the lithography machine, in order to achieve the same dose of each exposure during the exposure process, a complex dose control system is required; also in the wave aberration detection process, an equal energy output of the light source during the light integration process of each frame of phase shift interferogram, that is, dose control, is also required, which increases the complexity of the system. Moreover, the dose control error will affect the intensity of each phase shift interferogram, causing phase extraction errors, and affecting the accuracy of wave aberration detection. In addition, to achieve better dose control, enough light pulses are required in the light integration process, which also makes the measurement time longer and affects the measurement speed. Thus, there is still room for improvement in the complexity, detection accuracy and speed of the wave aberration detection system.

The multi-channel wave aberration detection device as disclosed in U.S. Pat. No. 7,333,216 is structural combination of single-channel detection devices in space, which can be considered to be synchronous work of a plurality of independent single-channel detection systems, and has the advantages of realizing multi-channel parallel detection, realizing distortion detection, improving the overall detection speed and the like due to parallel detection. The wave aberration detection method of each channel is not changed, so the problems that the control system is complex, the detection precision is influenced by the fluctuation of the light power of the light source, and the detection speed needs to be improved exist.

SUMMARY OF THE INVENTION

The present invention aims to overcome the defects of the current technology and provides a light intensity fluctuation-insensitive projection objective wave aberration detection device and a detection method, so that the wave aberration detection process is not influenced by light power fluctuation of a light source, reducing the complexity of system control, and improving the detection precision and the detection speed.

To achieve the above object, the technical solution of the present invention is as follows:

A light intensity fluctuation-insensitive projection objective wave aberration detection device comprises a light source and illumination system, an object plane marking plate, an object plane displacement table, a tested projection objective, an image plane marking plate, a two-dimensional photosensor, an image plane displacement table, and a control processing unit;

the light source and illumination system output spatially incoherent light;

the object plane marking plate is located on the object plane of the tested projection objective;

the object plane marking plate is carried by the object plane displacement table and displaced;

the image plane marking plate is located on the image plane of the tested projection objective;

the two-dimensional photosensor is located on the back side of the image plane marking plate along the light transmission direction, and receives light signal passing through the image plane marking plate, the receiving range including the image side numerical aperture of the tested projection objective;

the image plane marking plate and the two-dimensional photosensor are carried by the image plane displacement table and displaced;

the control processing unit controls the operations of the object plane displacement table, the image plane displacement table, and two-dimensional photosensor and processes the signal of the two-dimensional photosensor to obtain the wave aberration of the tested projection objective;

wherein the object plane marking plate comprises one or more pairs of object plane wave aberration test gratings, with the shear diffraction directions being the X direction and the Y direction respectively, and a pair of object plane light intensity test marks;

the object plane wave aberration test gratings and the object plane light intensity test marks are positioned in the object side field-of-view and uniformly illuminated by the light source and illumination system, and the illumination numerical aperture of the object plane wave aberration test grating fills the object side numerical aperture range of the tested projection objective;

the distance between the object plane wave aberration test grating pair is equal to the distance between the object plane light intensity test mark pair;

the image plane marking plate comprises one or more sets of image plane shear gratings matched with the object plane wave aberration test gratings and image plane light passing holes matched with the object plane light intensity test marks;

with the shear diffraction directions of the image plane shear grating being the X direction and Y direction;

the object plane wave aberration test grating, the object plane light intensity test marks, the image plane shear grating and the image plane light passing hole are used as a set, the distance between the matched object plane wave aberration test grating and the object plane light intensity test mark and the distance between the corresponding image plane shear grating and the image plane light passing hole satisfy the multiplying power relationship of the tested projection objective, so that as the object plane displacement table and the image plane displacement table are moved, the object plane wave aberration test grating and one object plane light intensity test mark in the X direction can be respectively imaged to positions of the image plane shear grating and the image plane light passing hole through the tested projection objective, and the object plane wave aberration test grating and another object plane light intensity test mark in the Y direction can also be respectively imaged to positions of the image plane shear grating and the image plane light passing hole through the tested projection objective;

the light imaged to the image plane shear grating generates multi-order diffraction to form shear interference fringes, and the shear diffraction direction is the shear direction of shear interference generated by the diffraction light of the image plane shear grating when the object plane wave aberration test grating is adopted; and the light imaged to the image plane light passing hole forms an emergent light spot through the image plane light passing hole;

the interference fringe formed by the image plane shear grating and the emergent light spot through the image plane light passing hole are simultaneously received by the two-dimensional photosensor, and the receiving pixel areas are different.

In the present invention, the object plane light intensity test mark is a grating, a light passing hole or any light passing pattern area.

In the present invention, the set of image plane shear gratings is one two-dimensional grating or two mutually orthogonal one-dimensional gratings.

In the present invention, when the object plane marking plate comprises a plurality of pairs of object plane wave aberration test gratings, distances between different sets of image plane shear gratings comprised in the image plane marking plate and distances between different pairs of object plane wave aberration test gratings satisfy the multiplying power relationship of the tested projection objective, so that the object plane wave aberration test grating and the image plane shear grating can be in a conjugate position, and wave aberration of a plurality of field-of-view points can be measured simultaneously.

In the present invention, the two-dimensional photo sensor is a CCD or CMOS camera adopting a global electronic shutter.

The present invention further provides a method for wave aberration detection using the light intensity fluctuation-insensitive projection objective wave aberration detection device includes the following steps:

(1) moving the object plane displacement table, and moving the object plane wave aberration test grating with the shear diffraction direction being the X direction in the object plane marking plate to the field-of-view point of the position of the tested projection objective lens; moving the image plane displacement table, so that the object plane wave aberration test grating is imaged on the image plane shear grating to form an interferogram in the X shear direction, which is received by the two-dimensional photosensor, and the interferogram in the X shearing direction of the object plane recorded as $Ix_0$; at the same time, the object plane light intensity test mark is imaged to the position of the image plane light passing hole to form an emergent light spot, which is received by another area of the two-dimensional photosensor, and the average value of the effective detection area of the emergent light spot is recorded as light intensity detection value $Rx_0$;

(2) moving the object plane displacement table or the image plane displacement table along the X direction to obtain a plurality of phase shift interferograms $Ixo_i$ in the X shear direction and light intensity detection values $Rx_i$ corresponding to each phase shift interferogram, wherein i=1, 2, 3, ... N and N is a positive integer; correcting the value of each phase shift interferogram $Ixo_i$ based on the light intensity detection values $Rx_i$ and $Rx_0$ to obtain a corrected phase shift interferogram $Ix_i$ in the X shear direction;

$$Ix_i = \frac{Rx_i}{Rx_0} \times Ixo_i, i = 1, 2, 3, \ldots N,$$

and then calculating the phase shift interferogram $Ix_0$ and $Ix_i$ in the X shear direction to obtain a shear phase in the X direction;

(3) moving the object plane displacement table, switching the object plane wave aberration test grating into a grating with the shear diffraction direction being the Y direction, when the image plane shear grating is a one-dimensional grating, switching the image plane shear grating at the same time, so that the interferogram Iy$_0$ in the Y shear direction is received by the two-dimensional photosensor, and meanwhile, the light intensity detection value Ry$_0$ is received in the other area of the two-dimensional photosensor;

(4) moving the object plane displacement table or the image plane displacement table along the Y direction to obtain a plurality of phase shift interferograms Iyo$_i$ in the Y shear direction and light intensity detection values Ry$_i$ corresponding to each phase shift interferogram, wherein i=1, 2, 3, . . . N and N is a positive integer; correcting the value of each phase shift interferogram Iyo$_i$ based on the light intensity detection values Ry$_i$ and Ry$_0$ to obtain a corrected phase shift interferogram Iy$_i$ in the Y shear direction;

$$Iy_i = \frac{Ry_i}{Ry_0} \times Iyo_i, i = 1, 2, 3, \ldots N,$$

and then calculating the phase shift interferogram Iy$_0$ and Iy$_i$ in the Y shear direction to obtain a shear phase in the Y direction; and (5) carrying out shear interference wavefront reconstruction by adopting shear phases in the X direction and the Y direction to obtain a wave aberration of the tested projection objective at a tested field-of-view point.

In the present invention, the interferogram in the X shear direction and the interferogram in the Y shear direction are single-channel interferograms or multi-channel interferograms, the single-channel interferogram is an interferogram corresponding to a field-of-view point, the multi-channel interferogram is divided into a plurality of mutually separated sub-interferogram regions, and each sub-interferogram is an interferogram corresponding to a field-of-view point.

The technical principle of the present invention is to improve the device structures and detection methods of the current technology, where a part of the two-dimensional photosensor is used to receive the shear interferogram, and the other part to receive the light intensity information, therefore the light intensity detection value corresponds to the light intensity fluctuation of the light source during the light integration period of the interferogram. When the two-dimensional photosensor adopts the global electronic shutter, the corresponding accuracy of the light intensity test result is higher; thus, the light intensity information can be used to accurately correct the light intensity fluctuation error corresponding to each phase shift interferogram, making the projection objective wave aberration detection device insensitive to the light intensity fluctuation of the light source; it is equivalent to adding a reference channel to the wave aberration detection channel in the prior art; the object plane wave aberration test grating and image plane shear grating of the present invention can adopt the design of the prior art, and the processing method of the corrected phase shift interferogram is also the same as the prior art, that is, it can be used in the single-channel wave aberration detection device, and can also be used in the multi-channel wave aberration detection device.

The present invention has the following technical effects:

Since the wave aberration detection device of the projection objective is insensitive to light intensity fluctuation of the light source, on one hand, the detection precision is improved, on the other hand, a complex dose control system and a high-stability light source are not needed, reducing complexity and cost of the system; in addition, when the light power of the light source is enough, the light integration time of each phase shift interferogram can be shortened, improving the detection speed.

DETAILED DESCRIPTION OF THE INVENTION

The present invention is further described below in conjunction with the accompanying drawings and embodiments, while the scope of the present invention should not be limited by them.

Figure 1:
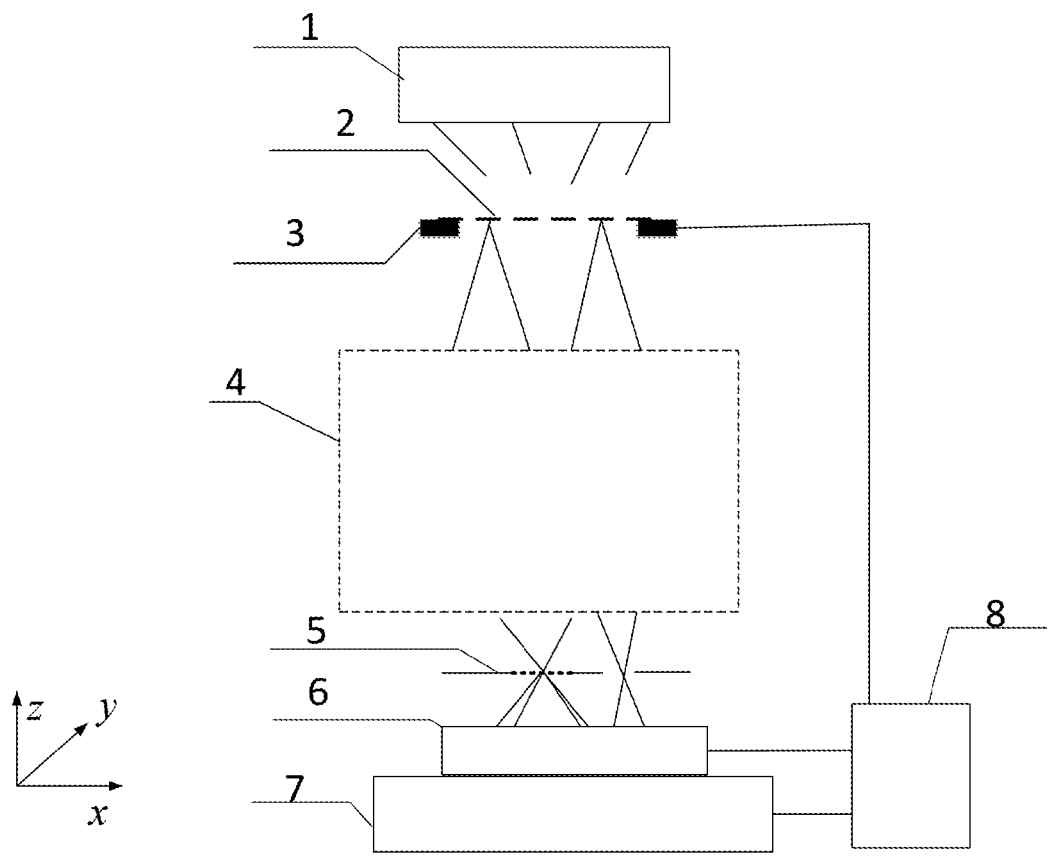
FIG. 1 shows the light intensity fluctuation-insensitive projection objective wave aberration detection device of the present invention.

As shown in FIG. 1, the light intensity fluctuation-insensitive projection objective wave aberration detection device of the present invention comprises a light source and illumination system 1, an object plane marking plate 2, an object plane displacement table 3, a tested projection objective 4, an image plane marking plate 5, a two-dimensional photosensor 6, an image plane displacement table 7, and a control processing unit 8; the light source and illumination system 1 output spatially incoherent light; the object plane marking plate 2 is located on the object plane of the tested projection objective 4; the object plane marking plate 2 is carried by the object plane displacement table 3 and displaced; the image plane marking plate 5 is located on the image plane of the tested projection objective 4; the two-dimensional photosensor 6 is located on the back side of the image plane marking plate 5 along the light transmission direction, and receives light signal passing through the image plane marking plate 5, the receiving range including the image side numerical aperture of the tested projection objective 4; the image plane marking plate 5 and the two-dimensional photosensor 6 are carried by the image plane displacement table 7 and displaced; the control processing unit 8 controls the operations of the object plane displacement table 3, the image plane displacement table 7, and two-dimensional photosensor 6 and processes the signal of the two-dimensional photosensor 6 to obtain the wave aberration of the tested projection objective 4; and the two-dimensional photosensor 6 is a CMOS camera using a global electronic shutter.

Figure 2:
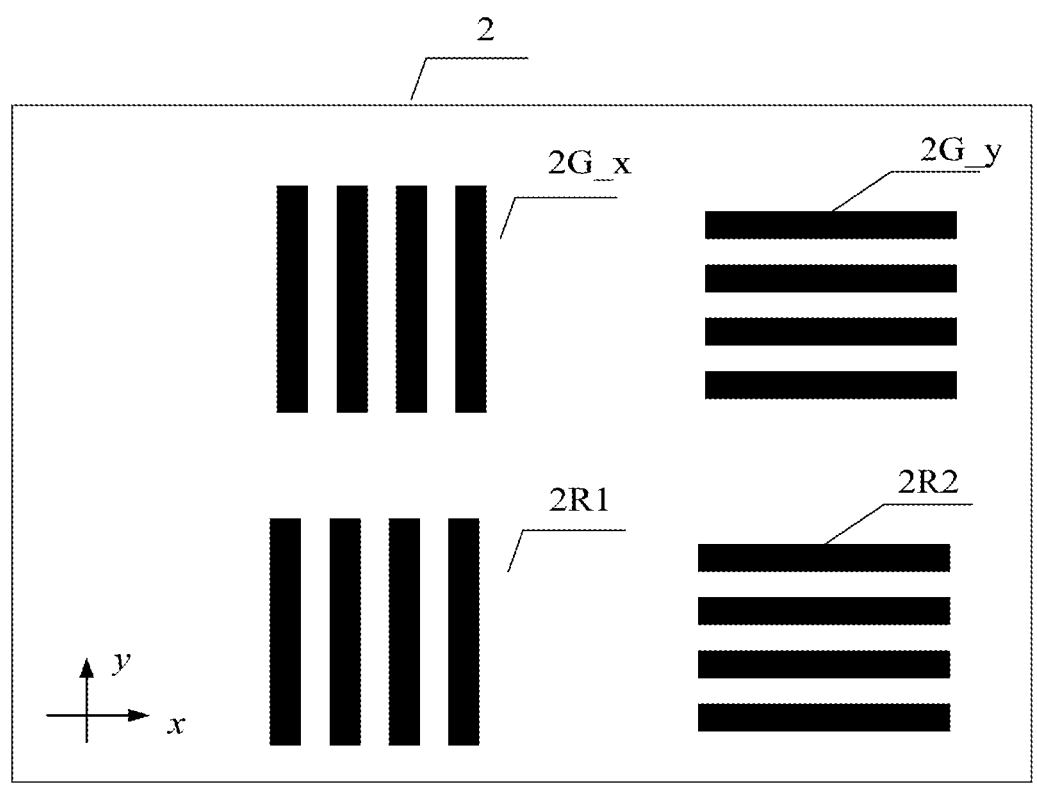
FIG. 2 shows the first embodiment of the object plane marking plate in the present invention.

As shown in FIG. 2, the first embodiment of the object plane marking plate 2 in the present invention comprises a pair of object plane wave aberration test gratings 2G_x and $2G\_y$ with the shear diffraction directions being X direction and Y direction respectively, and a pair of object plane light intensity test marks 2R1 and 2R2; the object plane wave aberration test gratings $2G\_x$, $2G\_y$ and the object plane light intensity test marks 2R1 and 2R2 are positioned in the object side field-of-view and uniformly illuminated by the light source and illumination system 1, and the illumination numerical aperture fills the object numerical aperture range of the tested projection objective 4 to be measured; the distance between the object plane wave aberration test grating pair $2G\_x$ and $2G\_y$ is equal to the distance between the object plane light intensity test mark pair 2R1 and 2R2; the object plane light intensity test marks 2R1 and 2R2 are gratings.

Figure 3:
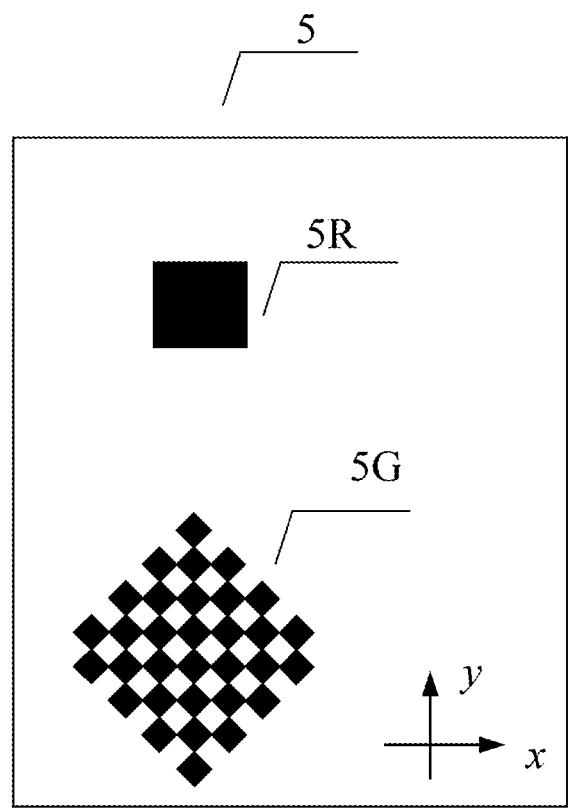
FIG. 3 shows the first embodiment of the image plane marking plate of the present invention.

As shown in FIG. 3, the first embodiment of the image plane marking plate 5 of the present invention comprises one image plane shear grating 5G used matched with the object plane wave aberration test gratings $2G\_x$ and $2G\_y$ in FIG. 2, and an image plane light passing hole 5R matched with the object plane light intensity test marks 2R1 and 2R2; the image plane shear grating 5G is one two-dimensional grating, with the shear diffraction directions being the X direction and the Y direction; the object plane wave aberration test grating, the object plane light intensity test marks, the image plane shear grating and the image plane light passing hole are used as a set; the distance between the object plane wave aberration test grating $2G\_x$ and the object plane light intensity test mark 2R1 is equal to that of the object plane wave aberration test grating $2G\_y$ and the object plane light intensity test mark 2R2, and the distance between the image plane shear grating 5G and the image plane light passing hole 5R satisfy the multiplying power relationship of the tested projection objective 4, so that as the object plane displacement table 3 and the image plane displacement table 7 are moved, the object plane wave aberration test grating $2G\_x$ and one object plane light intensity test mark 2R1 in the X direction can be respectively imaged to positions of the image plane shear grating 5G and the image plane light passing hole 5R through the tested projection objective 4, and the object plane wave aberration test grating $2G\_y$ and another object plane light intensity test mark 2R2 in the Y direction can also be respectively imaged to positions of the image plane shear grating 5G and the image plane light passing hole 5R through the tested projection objective; the light imaged to the image plane shear grating 5G generates multi-order diffraction to form shear interference fringes; when the object plane wave aberration test grating $2G\_x$ is used, the shear diffraction direction of the image plane shear grating 5G is the X direction, and when the object plane wave aberration test grating $2G\_y$ is used, the shear diffraction direction of the image plane shear grating 5G is Y direction, that is, the shear diffraction direction is the shear direction of shear interference generated by the diffracted light of the image plane shear grating 5G; the light that is imaged to the image plane light passing hole 5R, all passes through the image plane light passing hole 5R to form an emergent light spot.

Figure 4:
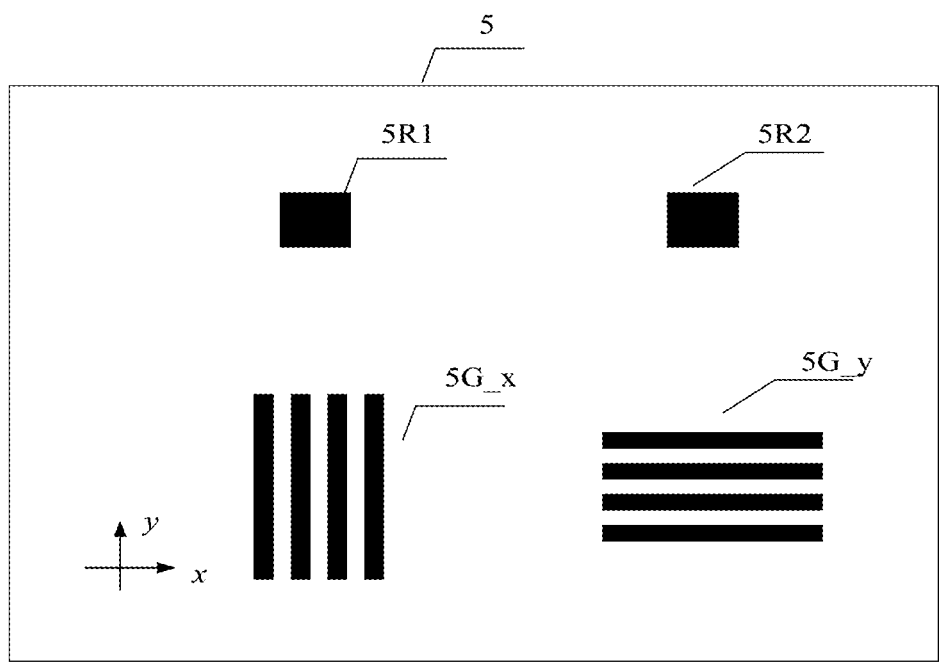
FIG. 4 shows the second embodiment of the image plane marking plate of the present invention.

As shown in FIG. 4, the second embodiment of the image plane marking plate 5 of the present invention comprises a set of image plane shear gratings $5G\_x$ and $5G\_y$ matched with the object plane wave aberration test gratings $2G\_x$ and $2G\_y$ in FIG. 2, and image plane light passing holes 5R1 and 5R2 matched with the object plane light intensity test marks 2R1 and 2R2; the image plane shear gratings $5G\_x$, $5G\_y$ are two orthogonal one-dimensional gratings, with the shear diffraction direction of the image plane shear grating $5G\_x$ being the X direction, and the shear diffraction direction of the image plane shear grating $5G\_y$ being the Y direction; the object plane wave aberration test grating, the object plane light intensity test marks, the image plane shear grating and the image plane light passing hole are used as a set; the distance between the object plane wave aberration test grating $2G\_x$ and the object plane light intensity test mark 2R1 and the distance between the image plane shear grating $5G\_x$ and the image plane light passing hole 5R1 satisfy the multiplying power relationship of the tested projection objective, the distance between the object plane wave aberration test grating $2G\_y$ and the object plane light intensity test mark 2R2, and the distance between the image plane shear grating $5G\_y$ and the image plane light passing hole 5R2 satisfy the multiplying power relationship of the tested projection objective, so that as the object plane displacement table 3 and the image plane displacement table 7 are moved, the object plane wave aberration test grating $2G\_x$ and one object plane light intensity test mark 2R1 in the X direction can be respectively imaged to positions of the image plane shear grating $5G\_x$ and the image plane light passing hole through the tested projection objective 4, and the object plane wave aberration test grating $2G\_y$ and another object plane light intensity test mark 2R2 in the Y direction can also be respectively imaged to positions of the image plane shear grating $5G\_y$ and the image plane light passing hole 5R2 through the tested projection objective 4; the light imaged to the image plane shear grating generates multi-order diffraction to form shear interference fringes, and the shear diffraction direction is the shear direction of shear interference generated by the diffraction light of the image plane shear grating when the object plane wave aberration test grating is adopted; in this embodiment, the object plane wave aberration test gratings $2G\_x$ and $2G\_y$ cannot be simultaneously imaged to the image plane shear gratings $5G\_x$ and $5G\_y$ respectively to avoid interference between interference fringes.

Figure 5:
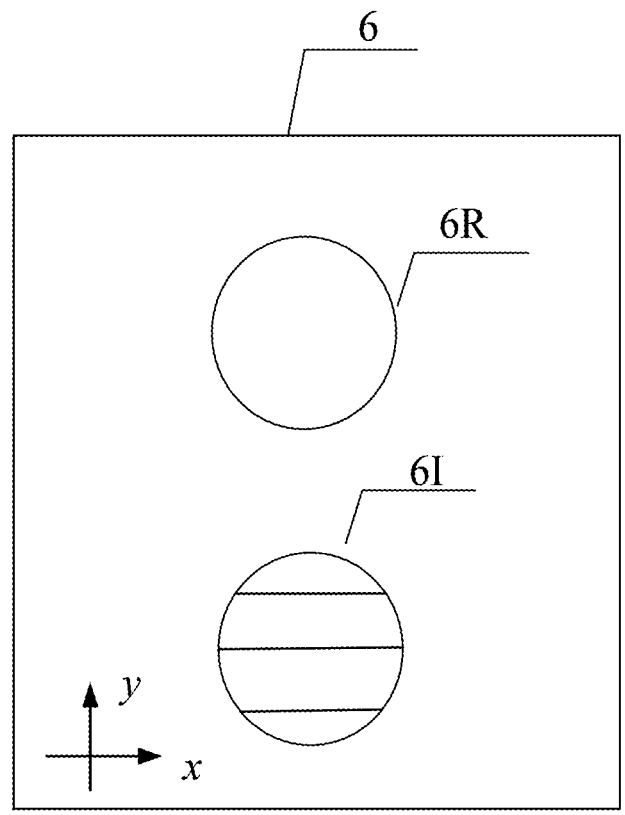
FIG. 5 shows the first view of the image received by the two-dimensional photosensor of the light intensity fluctuation-insensitive projection objective wave aberration detection device of the present invention.

The image received by the two-dimensional photosensor 6 of the projection objective wave aberration detection device of the present invention is shown in FIG. 5 when the embodiments of FIGS. 2 and 3 are used, and the interference fringes 61 formed by the image plane shear grating 5G and the emergent light spot 6R passing through the image plane light passing hole 5R are simultaneously received by the two-dimensional photosensor 6, and the receiving pixel areas are different.

Figure 6:
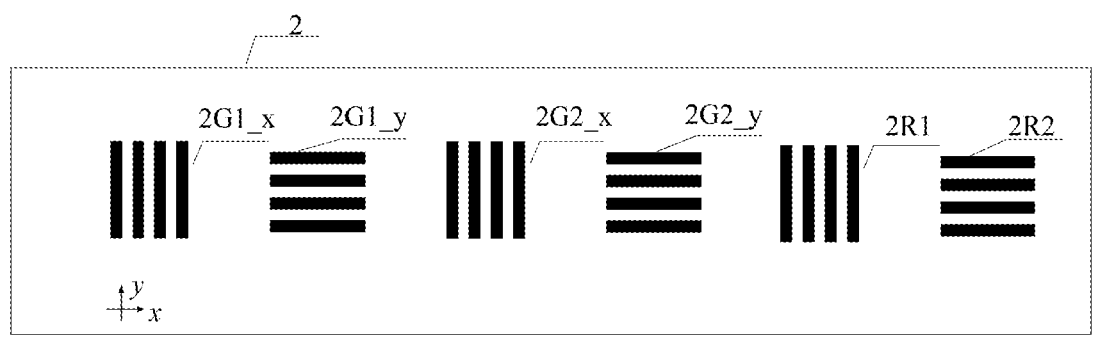
FIG. 6 shows the second embodiment of the object plane marking plate of the present invention.

As shown in FIG. 6, the first embodiment of the object plane marking plate 2 of the present invention comprises a pair of object plane wave aberration test gratings $2G1\_x$, $2G1\_y$ and $2G2\_x$, $2G2\_y$ with shear diffraction directions in X direction and Y direction respectively, and a pair of object plane light intensity test marks 2R1 and 2R2; the object plane wave aberration test gratings $2G1\_x$, $2G1\_y$, $2G2\_x$, $2G2\_y$ and the object plane light intensity test marks 2R1 and 2R2 are positioned in the object side field-of-view and uniformly illuminated by the light source and illumination system 1, and the illumination numerical aperture fills the object numerical aperture range of the tested projection objective 4 to be measured; the distance between the first object plane wave aberration test grating pair $2G1\_x$ and $2G1\_y$, the distance between the second object plane wave aberration test grating pair $2G2\_x$ and $2G2\_y$, the distance between the object plane light intensity test mark pair 2R1 and 2R2, is equal; and the object plane light intensity test marks 2R1 and 2R2 are gratings.

Figure 7:
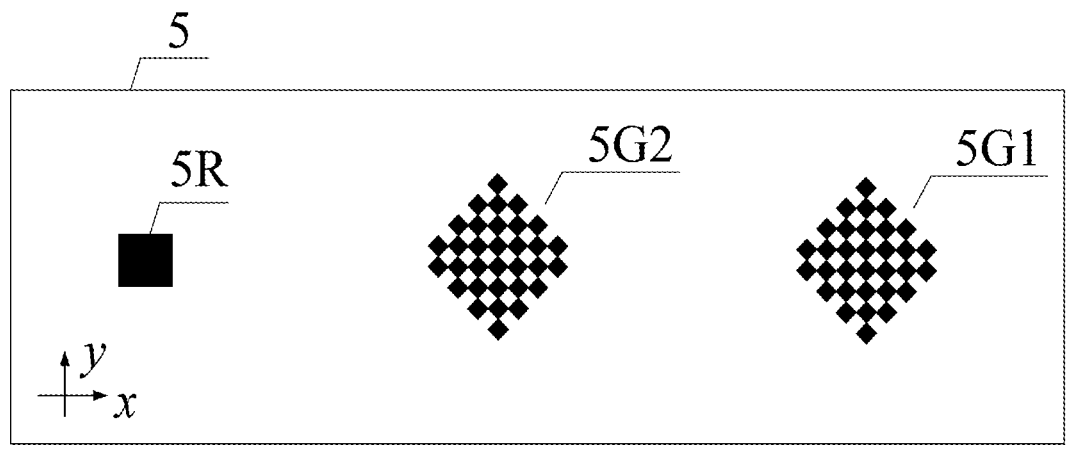
FIG. 7 shows the third embodiment of the image plane marking plate of the present invention.

As shown in FIG. 7, the third embodiment of the image plane marking plate 5 of the present invention comprises two sets of image plane shear gratings 5G1, 5G2 mated with the object plane wave aberration test gratings 2G1_x, 2G1_y, 2G2_x, and 2G2_y in FIG. 6 and image plane light passing hole 5R used in conjunction with object plane light intensity test marks 2R1, 2R2; the image plane shear gratings 5G1 and 5G2 are two-dimensional checkerboard gratings, and its shear diffraction directions are the X direction and the Y direction; As the object plane displacement table 3 and the image plane displacement table 7 are moved, the object plane wave aberration test grating 2G1_x and 2G2_x and one object plane light intensity test mark 2R1 in the X direction can be respectively imaged to positions of the image plane shear grating 5G1 and 5G2 and the image plane light passing hole 5R through the tested projection objective 4, and the object plane wave aberration test grating 2G1_y and 2G2_y and another object plane light intensity test mark 2R2 in the Y direction can also be respectively imaged to positions of the image plane shear grating 5G1 and 5G2 and the image plane light passing hole 5R through the tested projection objective 4; the light imaged to the image plane shear grating generate multi-order diffraction to form shear interference fringes, the shear diffraction direction is the shear direction of shear interference generated by the diffraction light of the image plane shear grating when the object plane wave aberration test grating is adopted.

In the embodiments shown in FIGS. 6 and 7, the object plane marking plate 2 comprises a plurality of pairs of object plane wave aberration test gratings, and the image plane marking plate 5 includes different sets of image plane shear gratings 5G1, 5G2; the distance between the object plane wave aberration test gratings 2G1_x and 2G2_x is equal to the distance between object wave aberration test gratings 2G1_y and 2G2_y; the distance between image plane shear gratings 5G1 and 5G2 and the distance between the object plane wave aberration test gratings 2G1_x and 2G2_x satisfy the multiplying power relationship of the tested projection objective 4, so that the object wave aberration test grating and the image plane shear grating (image plane shear grating 5G1, 5G2 and object wave aberration test grating 2G1_x, 2G2_x, and the image plane shear gratings 5G1 and 5G2 and the object wave aberration test gratings 2G1_y, 2G2_y) can be in a conjugate position to measure wave aberrations at multiple field-of-view points at the same time.

Figure 8:
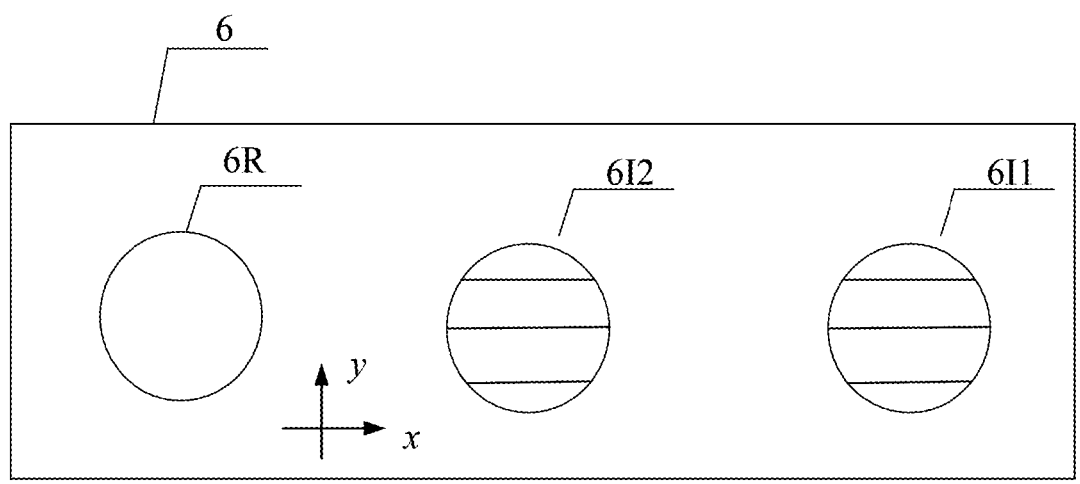
FIG. 8 shows the second view of the image received by the two-dimensional photosensor of the light intensity fluctuation-insensitive projection objective wave aberration detection device of the present invention.

The image received by the two-dimensional photosensor 6 of the projection objective wave aberration detection device of the present invention is shown in FIG. 8 when the embodiments of FIGS. 6 and 7 are used, and the interference fringes 611 and 612 formed by the image plane shear grating 5G1 and 5G2 and the emergent light spot 6R passing through the image plane light passing hole 5R are simultaneously received by the two-dimensional photosensor 6, and the receiving pixel areas are different.

The method for wave aberration detection using the light intensity fluctuation-insensitive projection objective wave aberration detection device of the present invention comprises the following steps:

(1) moving the object plane displacement table 3, and moving the object plane wave aberration test grating with the shear diffraction direction being the X direction in the object plane marking plate 2 to the field-of-view point of the position of the tested projection objective 4; moving the image plane displacement table 7, so that the object plane wave aberration test grating is imaged on the image plane shear grating to form an interferogram in the X shear direction, which is received by the two-dimensional photosensor 6, and the interferogram in the X shear direction of the object plane recorded as $Ix_0$; at the same time, the light intensity test mark on the object plane is imaged to the position of the image plane light passing hole to form an emergent light spot, which is received by another area of the two-dimensional photosensor 6, and the average value of the effective detection area of the emergent light spot is recorded as light intensity detection value $Rx_0$;

(2) moving the object plane displacement table 3 or the image plane displacement table 7 along the X direction to obtain a plurality of phase shift interferograms $Ixo_i$ in the X shear direction and light intensity detection values $Rx_i$ corresponding to each phase shift interferogram, wherein i=1, 2, 3, . . . N and N is a positive integer; correcting the value of each phase shift interferogram $Ixo_i$ based on the light intensity detection values $Rx_i$ and $Rx_0$ to obtain a corrected phase shift interferogram $Ix_i$ in the X shear direction;

$$Ix_i = \frac{Rx_i}{Rx_0} \times Ixo_i, i = 1, 2, 3, \ldots N,$$

and then calculating the phase shift interferogram $Ix_0$ and $Ix_i$ in the X shear direction to obtain a shear phase in the X direction;

(3) moving the object plane displacement table 3, switching the object plane wave aberration test grating into a grating with the shear diffraction direction being the Y direction, when the image plane shear grating is a one-dimensional grating, switching the image plane shear grating at the same time, so that the interferogram $Iy_0$ in the Y shear direction is received by the two-dimensional photosensor 6, and meanwhile, the light intensity detection value $Ry_0$ is received in the other area of the two-dimensional photosensor 6;

(4) moving the object plane displacement table 3 or the image plane displacement table 7 along the Y direction to obtain a plurality of phase shift interferograms $Iyo_i$ in the Y shear direction and light intensity detection values $Ry_i$ corresponding to each phase shift interferogram, wherein i=1, 2, 3, . . . N and N is a positive integer; correcting the value of each phase shift interferogram $Iyo_i$ based on the light intensity detection values $Ry_i$ and $Ry_0$ to obtain a corrected phase shift interferogram $Iy_i$ in the Y shear direction;

$$Iy_i = \frac{Ry_i}{Ry_0} \times Iyo_i, i = 1, 2, 3, \ldots N,$$

and then calculating the phase shift interferogram $Iy_0$ and $Iy_i$ in the Y shear direction to obtain a shear phase in the Y direction; and (5) carrying out shear interference wavefront reconstruction by adopting shear phases in the X direction and the Y direction to obtain a wave aberration of the tested projection objective 4 at a tested field-of-view point.

The interferogram in the X shear direction and the interferogram in the Y shear direction are single-channel interferograms or multi-channel interferograms, the single-channel interferogram is an interferogram corresponding to a field-of-view point, the multi-channel interferogram is divided into a plurality of mutually separated sub-interferogram regions, and each sub-interferogram is an interferogram corresponding to a field-of-view point; in the embodiment of FIG. 5, 61 is a single-channel interferogram, and in the embodiment of FIGS. 8, 611 and 612 are multi-channel interferograms.

The object plane wave aberration test grating, the image plane shear grating parameters, and the data processing method as mentioned above may be used in the embodiments of the present invention.

The embodiment of the present invention has the following technical effects: the wave aberration detection device of the projection objective is insensitive to light intensity fluctuation of the light source, so that on one hand, the detection precision is improved, on the other hand, a complex dose control system is not needed, reducing complexity and cost of the system; the light integration time of each phase shift interferogram is shortened, improving the detection speed.

We claim:

1. A light intensity fluctuation-insensitive projection objective wave aberration detection device, comprising
a light source and illumination system (1),
an object plane marking plate (2),
an object plane displacement table (3),
a tested projection objective (4),
an image plane marking plate (5),
a two-dimensional photosensor (6),
an image plane displacement table (7), and
a control processing unit (8),
wherein the object plane marking plate (2), the object plane displacement table (3), the tested projection objective (4), the image plane marking plate (5), the two-dimensional photosensor (6), and the image plane displacement table (7) are sequentially arranged along direction of a spatially incoherent light output by the light source and illumination system (1);
the object plane marking plate (2) is carried by the object plane displacement table (3), and the object plane marking plate (2) is located on the object plane of the tested projection objective (4);
the image plane marking plate (5) and the two-dimensional photosensor (6) are carried and displaced by the image plane displacement table (7);
the image plane marking plate (5) is located on the image plane of the tested projection objective (4);
the two-dimensional photosensor (6) receives a light signal passing through the image plane marking plate (5), the light signal comprising an image side numerical aperture of the tested projection objective (4);
the control processing unit (8) is respectively connected to the object plane displacement table (3), the image plane displacement table (7), and the two-dimensional photosensor (6);
the object plane marking plate (2) comprises one or more pairs of object plane wave aberration test gratings with the shear diffraction directions being the X direction and the Y direction, respectively, and a pair of object plane light intensity test marks;
the object plane wave aberration test gratings and the object plane light intensity test marks are positioned in the object side field-of-view and uniformly illuminated by the light source and illumination system (1), and the illumination numerical aperture of the object plane wave aberration test grating fills the object side numerical aperture range of the tested projection objective (4);
the distance between the object plane wave aberration test grating pair is equal to the distance between the object plane light intensity test mark pair;
the image plane marking plate (5) comprises one or more sets of image plane shear gratings matched with the object plane wave aberration test gratings and image plane light passing holes matched with the object plane light intensity test marks;
the shear diffraction directions of the image plane shear grating are the X direction and Y direction;
the object plane wave aberration test grating, the object plane light intensity test marks, the image plane shear grating and the image plane light passing hole are used as a set, the distance between the matched object plane wave aberration test grating and the object plane light intensity test mark and the distance between the corresponding image plane shear grating and the image plane light passing hole satisfy the multiplying power relationship of the tested projection objective so that as the object plane displacement table (3) and the image plane displacement table (7) are moved, the object plane wave aberration test grating and one object plane light intensity test mark in the X direction are respectively imaged to positions of the image plane shear grating and the image plane light passing hole through the tested projection objective (4), and the object plane wave aberration test grating and another object plane light intensity test mark in the Y direction are also be respectively imaged to positions of the image plane shear grating and the image plane light passing hole through the tested projection objective;
the light imaged to the image plane shear grating generates multi-order diffraction to form shear interference fringes, and the shear diffraction direction is the shear direction of shear interference generated by the diffraction light of the image plane shear grating when the object plane wave aberration test grating is adopted;
the light imaged to the image plane light passing hole forms an emergent light spot through the image plane light passing hole; and
the interference fringe formed by the image plane shear grating and the emergent light spot through the image plane light passing hole are simultaneously received by the two-dimensional photosensor (6), and the receiving pixel areas are different.

2. The device of claim 1, wherein the object plane light intensity test mark is a grating, a light passing hole, or a light passing pattern area.

3. The device of claim 1, wherein the set of image plane shear gratings is a single two-dimensional grating or two mutually orthogonal one-dimensional gratings.

4. The device of claim 1, wherein the object plane marking plate (2) comprises a plurality of pairs of object plane wave aberration test gratings, and distances between different sets of image plane shear gratings comprised in the image plane marking plate (5) and distances between different pairs of object plane wave aberration test gratings satisfy the multiplying power relationship of the tested projection objective, so that the object plane wave aberration test grating and the image plane shear grating are in a conjugate position, and wave aberrations of a plurality of field-of-view points are measured simultaneously.

5. The device of claim 1, wherein the two-dimensional photosensor (6) is a CCD or CMOS camera with a global electronic shutter.

6. A method for detecting wave aberration using the device of claim 1, comprising:
(1) moving the object plane displacement table (3), and moving the object plane wave aberration test grating with the shear diffraction direction being the X direction in the object plane marking plate (2) to the field-of-view point of the position of the tested projection objective (4);

moving the image plane displacement table (7) so that the object plane wave aberration test grating is imaged on the image plane shear grating to form an interferogram in the X shear direction and received by the two-dimensional photo sensor (6) with the interferogram in the X shear direction of the object plane recorded as $Ix_0$; at same time, the light intensity test mark on the object plane is imaged to the position of the image plane light passing hole to form an emergent light spot, which is received by another area of the two-dimensional photosensor (6), and the average value of the effective detection area of the emergent light spot is recorded as light intensity detection value $Rx_0$;

(2) moving the object plane displacement table (3) or the image plane displacement table (7) along the X direction to obtain a plurality of phase shift interferograms $Ixo_i$ in the X shear direction and light intensity detection values $Rx_i$ corresponding to each phase shift interferogram, wherein i=1, 2, 3, . . . N, wherein N is a positive integer;

correcting the value of each phase shift interferogram $Ixo_i$ based on the light intensity detection values $Rx_i$ and $Rx_0$ to obtain a corrected phase shift interferogram $Ix_i$ in the X shear direction;

$$Ix_i = \frac{Rx_i}{Rx_0} \times Ixo_i, i = 1, 2, 3, \ldots N,$$

and then calculating the phase shift interferogram $Ix_0$ and $Ix_i$ in the X shear direction to obtain a shear phase in the X direction;

(3) moving the object plane displacement table (3), switching the object plane wave aberration test grating into a grating with the shear diffraction direction being the Y direction, when the image plane shear grating is a one-dimensional grating, switching the image plane shear grating at the same time, so that the interferogram $Iy_0$ in the Y shear direction is received by the two-dimensional photosensor (6) and the light intensity detection value $Ry_0$ is received in another area of the two-dimensional photosensor (6);

(4) moving the object plane displacement table (3) or the image plane displacement table (7) along the Y direction to obtain a plurality of phase shift interferograms $Iyo_i$ in the Y shear direction and light intensity detection values $Ry_i$ corresponding to each phase shift interferogram, wherein i=1, 2, 3, . . . N, wherein N is a positive integer;

correcting the value of each phase shift interferogram $Iyo_i$ based on the light intensity detection values $Ry_i$ and $Ry_0$ to obtain a corrected phase shift interferogram $Iy_i$ in the Y shear direction;

$$Iy_i = \frac{Ry_i}{Ry_0} \times Iyo_i, i = 1, 2, 3, \ldots N,$$

calculating the phase shift interferogram $Iy_0$ and $Iy_i$ in the Y shear direction to obtain a shear phase in the Y direction; and (5) carrying out shear interference wavefront reconstruction by adopting shear phases in the X direction and the Y direction to obtain a wave aberration of the tested projection objective (4) at a tested field-of-view point.

7. The method of claim 6, wherein the interferogram in the X shear direction and the interferogram in the Y shear direction are single-channel interferograms or multi-channel interferograms, the single-channel interferogram is an interferogram corresponding to a field-of-view point, the multi-channel interferogram is divided into a plurality of mutually separated sub-interferogram regions, and each sub-interferogram is an interferogram corresponding to a field-of-view point.

* * * * *